(12) United States Patent
Nagadomi et al.

(10) Patent No.: US 9,075,740 B2
(45) Date of Patent: Jul. 7, 2015

(54) MEMORY SYSTEM

(71) Applicant: KABUSHIKI KAISHA TOSHIBA, Minato-ku (JP)

(72) Inventors: Yasushi Nagadomi, Yokohama (JP); Daisaburo Takashima, Yokohama (JP); Kosuke Hatsuda, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/296,001

(22) Filed: Jun. 4, 2014

(65) Prior Publication Data

US 2014/0289588 A1 Sep. 25, 2014

Related U.S. Application Data

(62) Division of application No. 12/529,473, filed as application No. PCT/JP2009/054375 on Mar. 3, 2009.

(30) Foreign Application Priority Data

Mar. 7, 2008 (JP) ................. 2008-058549

(51) Int. Cl.
*G06F 12/00* (2006.01)
*G06F 11/10* (2006.01)
*G06F 12/02* (2006.01)
*G11C 16/10* (2006.01)

(52) U.S. Cl.
CPC ........ *G06F 11/1016* (2013.01); *G06F 12/0246* (2013.01); *G06F 2212/7203* (2013.01); *G06F 2212/7209* (2013.01); *G11C 16/102* (2013.01)

(58) Field of Classification Search
None
See application file for complete search history.

(56) References Cited

U.S. PATENT DOCUMENTS 8,327,065 B2 12/2012 Yano et al.
2004/0255225 A1 12/2004 Takai
(Continued)

FOREIGN PATENT DOCUMENTS

JP 7-14392 1/1995
JP 2001-92723 4/2001
(Continued)

OTHER PUBLICATIONS

European Search Report issued Oct. 6, 2011, in Patent Application No. 09709442.9.
(Continued)

*Primary Examiner* — Baboucarr Faal
(74) *Attorney, Agent, or Firm* — Oblon, McClelland, Maier & Neustadt, L.L.P.

(57) ABSTRACT

A memory system (10) is disclosed, which comprises a flash-EEPROM nonvolatile memory (11) having a plurality of memory cells that have floating gates and in which data items are electrically erasable and writable, a cache memory (13) that temporarily stores data of the flash-EEPROM nonvolatile memory (11), a control circuit (12, 14) that controls the flash-EEPROM nonvolatile memory (11) and the cache memory (13), and an interface circuit (16) that communicates with a host, in which the control circuit functions to read data from a desired target area to-be-determined of the flash-EEPROM nonvolatile memory and detect an erased area to determine a written area/unwritten area by using as a determination condition whether or not a count number of data "0" of the read data has reached a preset criterion count number.

10 Claims, 11 Drawing Sheets

(56) References Cited

U.S. PATENT DOCUMENTS

| | | |
|---|---|---|
| 2006/0077720 A1 | 4/2006 | Im |
| 2006/0112215 A1 | 5/2006 | Kim et al. |
| 2006/0181949 A1* | 8/2006 | Kini .................. 365/230.03 |
| 2007/0140007 A1 | 6/2007 | Terauchi |
| 2007/0255898 A1 | 11/2007 | Nishide et al. |
| 2008/0016267 A1 | 1/2008 | Oyaizu |

FOREIGN PATENT DOCUMENTS

| | | |
|---|---|---|
| JP | 2001-125834 | 5/2001 |
| JP | 2004-234545 | 8/2004 |
| JP | 2004-310268 | 11/2004 |
| JP | 2005-353171 | 12/2005 |
| JP | 2006-114042 | 4/2006 |
| JP | 2007-172259 | 7/2007 |
| JP | 2008-9874 | 1/2008 |
| TW | I 267862 | 12/2006 |
| TW | I 283370 | 7/2007 |
| WO | WO 2006/054852 A1 | 5/2006 |

OTHER PUBLICATIONS

Combined Taiwanese Office Action and Search Report issued Jun. 17, 2013 in Patent Application No. 098107165 (with English language translation).

* cited by examiner

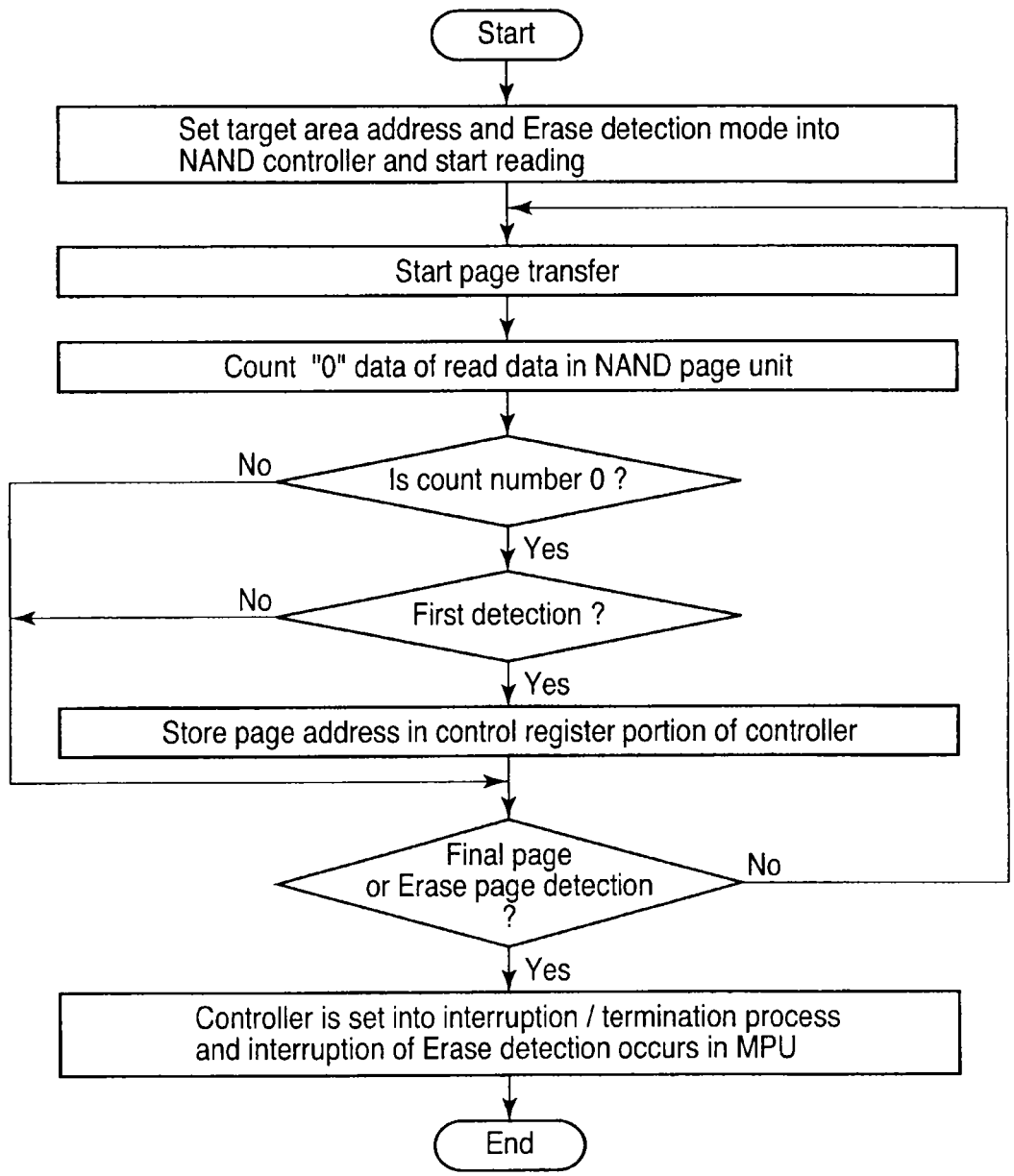
F I G. 4

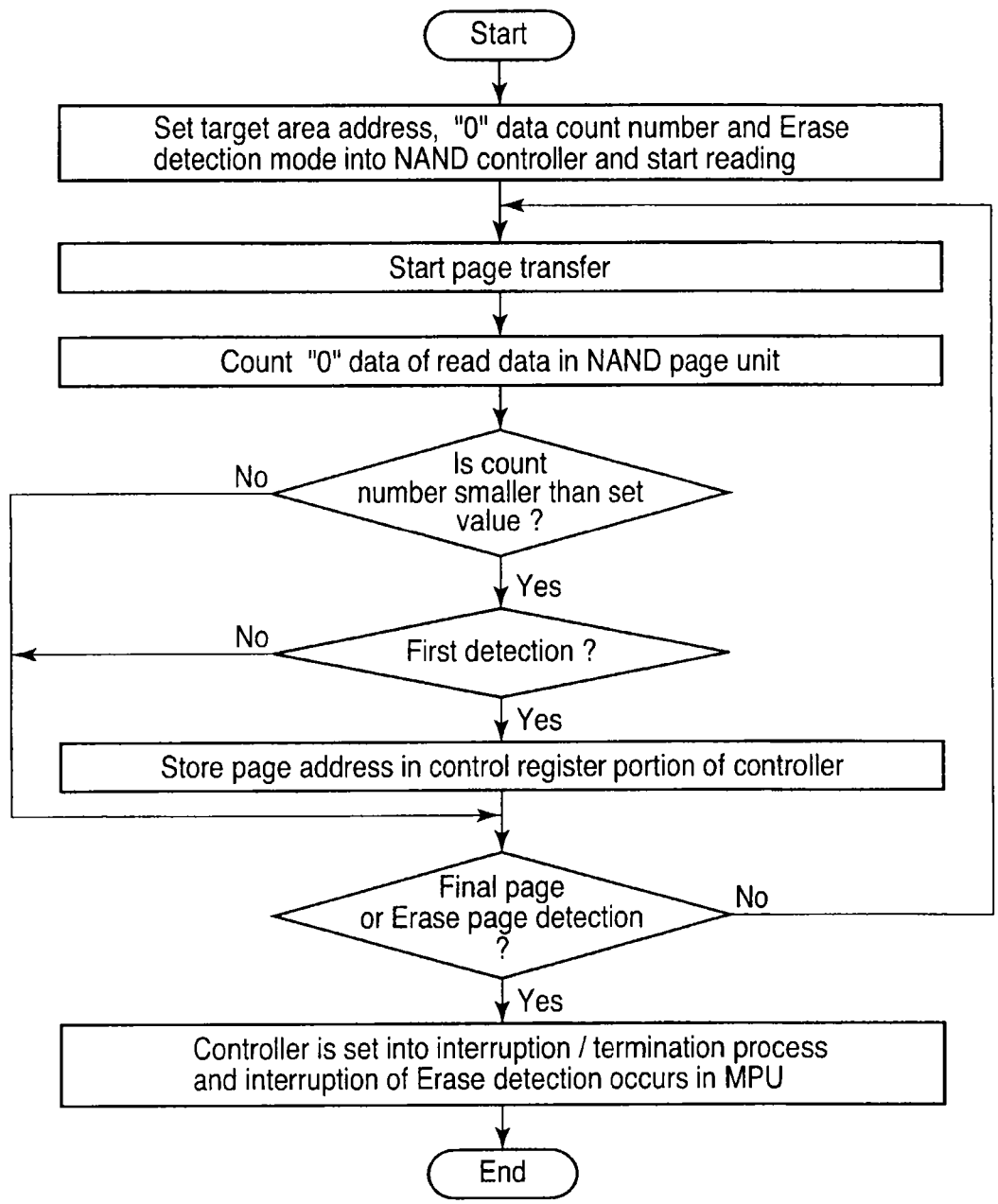
F I G. 5

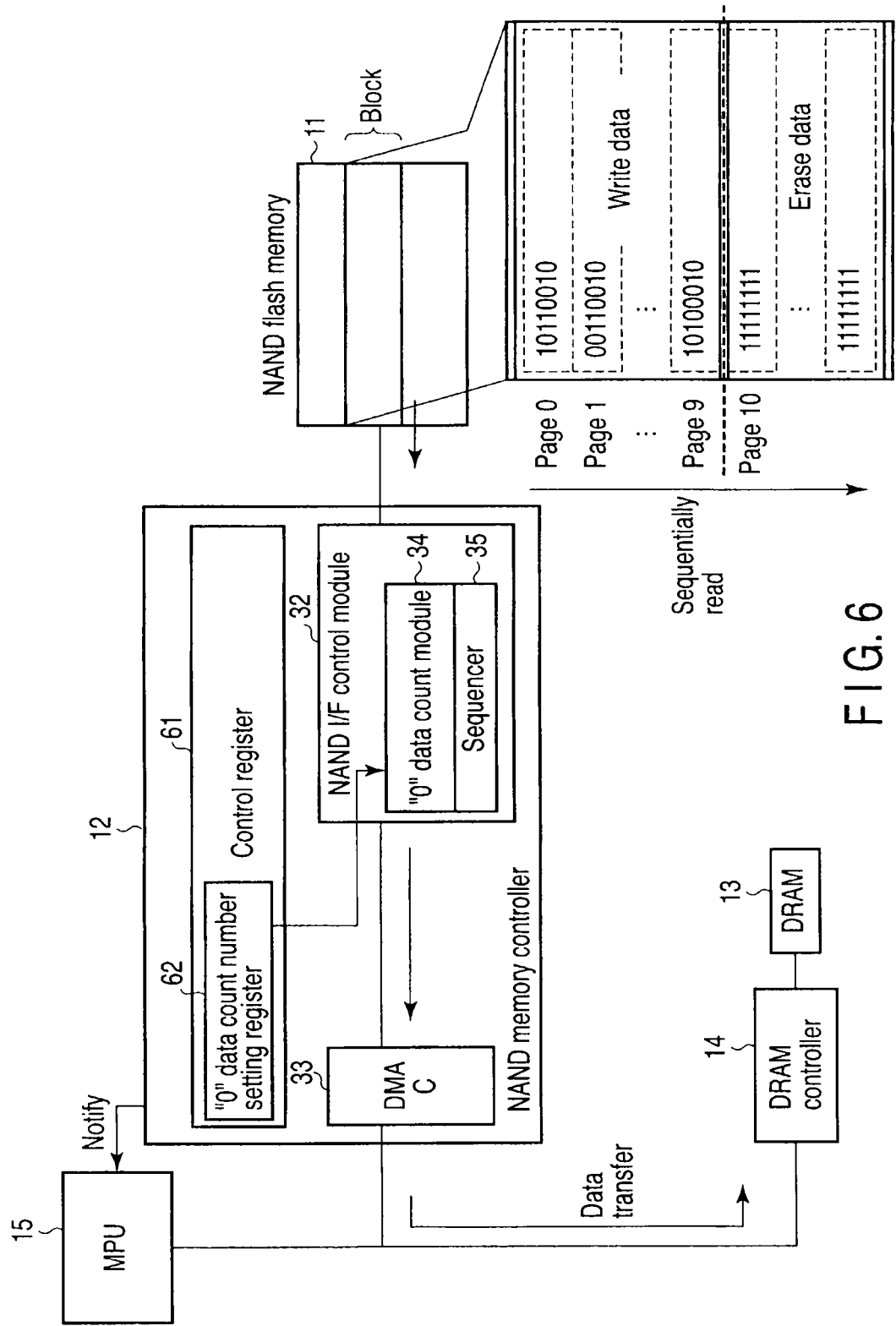
F I G. 6

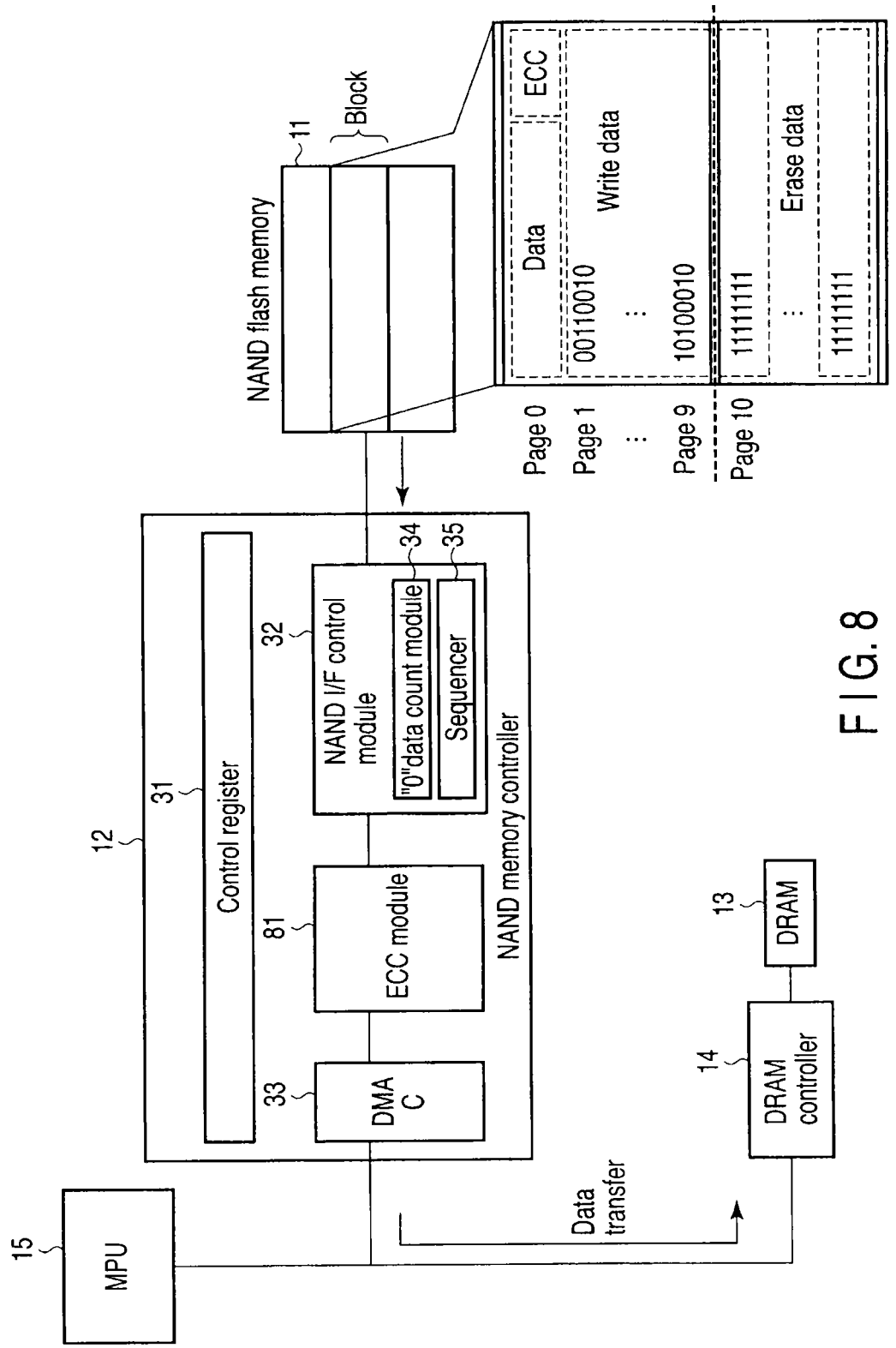
F I G. 8

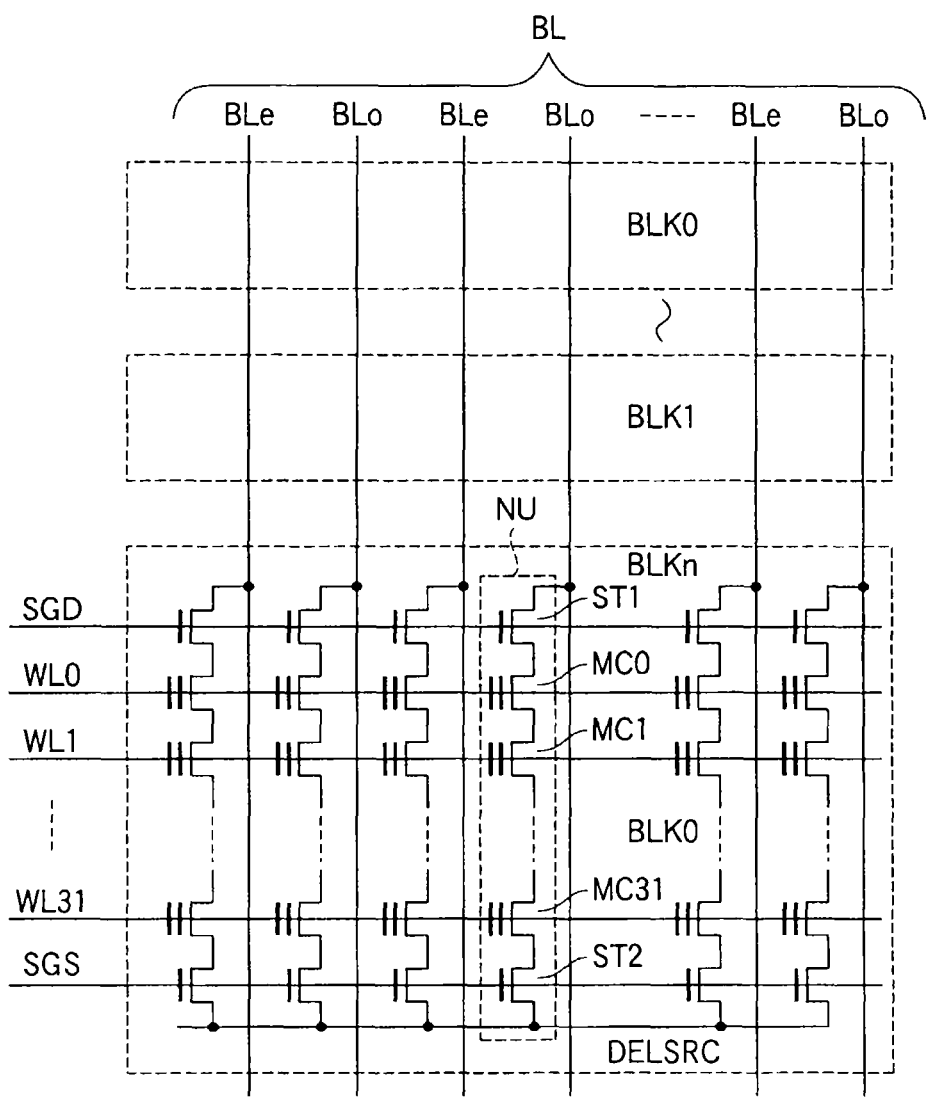
F I G. 11

MEMORY SYSTEM

CROSS-REFERENCE TO RELATED APPLICATIONS

This application is a Divisional of and claims the benefit of priority under 35 U.S.C. §120 from U.S. application Ser. No. 12/529,473, filed Sep. 1, 2009, which is the U.S. national phase application under 35 U.S.C. §371 of international application PCT/JP2009/054375 (not published in English), filed Mar. 3, 2009, and claims priority to Japanese patent application no. 2008-058549 filed on Mar. 7, 2008, the entire contents of each of which are incorporated herein by reference.

TECHNICAL FIELD

This invention relates to a memory system using a flash-EEPROM nonvolatile memory, and more particularly to a memory system that uses a NAND flash memory having an ascending-order programming restriction and is used instead of a hard disk device, for example.

BACKGROUND ART

At present, semiconductor memories are used in various devices, including main memory devices of large-scale computers, personal computers, home electrical appliances, mobile phones and the like. Memories that are now dominantly used in the market are flash-EEPROM nonvolatile memories, represented by NAND-Flash memories. Since the flash-EEPROM nonvolatile memories are configured to maintain data even if the power source is turned off and have structures suitable for integration with high density, they are now used in various information devices such as mobile telephones and digital cameras. That is, the flash-EEPROM nonvolatile memories are widely used as storage media for digital cameras, digital video devices, portable personal computer and MP3 music devices, storage media for storing information items of images, moving pictures, sound, games in digital television receivers, or various memory cards (SD cards, MMC cards, MS cards, CF cards and the like). Further, they are also widely used as memories (USB memories) that are compatible with USB as storage media of personal computers and memories of mobile telephones.

The flash-EEPROM nonvolatile memories are mainly divided into NOR memories (NOR flash memories) and NAND memories (NAND flash memories). The NOR flash memory has a characteristic that the number of read/read operations is approximately $10^{13}$ making it suitable for use as a storage medium of instruction codes in a mobile device. However, since the effective bandwidth of writing is small, it is not suitable for file recording.

On the other hand, the NAND flash memory has a read characteristic that the access time is approximately 25 μs, which is long, but it can be integrated with higher density in comparison with the NOR flash memory. Further, burst reading can be performed and the effective bandwidth is large. In the write characteristic, the program time is 200 μs and the erase time is 1 ms, which are long. However, since the number of bits that can be simultaneously programmed or erased is large, write data can be taken in by a burst operation and a large number of bits can be simultaneously programmed in units of pages, the effective bandwidth becomes large.

Since the NAND flash memory can be integrated with high density so as to attain a large storage capacity, its use in place of a hard disk has recently been considered. However, there are some restrictions on usage. First, since data degradation occurs due to writing/erasing (programming/erasing), there are restrictions on the number of writable/erasable operations. That is, in the program operation of the NAND flash memory, electrons are injected into the floating gate by applying a high voltage to the gate of a memory cell transistor with respect to the substrate. If the above operations are repeatedly performed, an oxide film around the floating gate of the memory cell transistor is degraded and data is destroyed. In the NAND flash memory now used, the number of writable/erasable operations is approximately $10^5$ and is extremely small in comparison with that of other types of nonvolatile memory. Further, it is predicted that the number of writable/erasable operations will be further reduced with miniaturization in the future processing and multivalue-coding of cells. If the NAND flash memory is used as a memory card or USB memory, it takes a relatively long time to make approximately $10^5$ accesses, thus the NAND flash memory can be used in practice. However, if the NAND flash memory is mounted in a system and used instead of a hard disk, accesses of approximately $10^5$ times will occur in a relatively short period of time.

Further, a restriction of rewriting inhibition is imposed on the NAND flash memory. That is, programming of the NAND flash memory can be controlled only in the direction (the direction of data "1"→data "0": "0" writing) in which electrons are injected into the floating gate and erasing must be performed when electrons are extracted (the direction of data "0"→data "1": "1" writing). At this time, generally, programming is performed in page units but erasing can be performed only in block units, comprised of several pages. Therefore, when data of a programmed page is changed, it is necessary to temporarily save the entire amount of data in a block containing the page of the data to be changed into another area, erase the data and then perform the program operation again. In practice, since the number of rewritable/erasable operations is restricted, the program/erase operations are prevented from being excessively performed by writing a to-be-rewritten page into another erased area and managing the same by using a logical-physical conversion table.

As a further restriction condition of the NAND flash memory, page reverse-order programming is inhibited in the NAND flash memory. For example, there is a restriction that programming must be performed in an ascending order from the page address "0" when programming is performed in a block.

When a memory system using the above NAND flash memory is configured, particularly, when a memory system used instead of a hard disk is configured, at present, the memory system is often configured by a volatile RAM for data cache and management information storage and a NAND flash memory for nonvolatile main storage. With the above configuration, since a command (flash cache command) for saving data of the volatile memory area into the nonvolatile memory area is frequently issued from the host side as a countermeasure against instantaneous turn-off of the memory system, it resultantly becomes necessary to add an updating portion of management information (that is hereinafter referred as a management log) into the NAND flash memory.

In the above memory system, it is necessary to extract the newest information from the management log written into the NAND flash memory and reconstruct management information each time the power source is turned on. At this time, it is necessary to grasp the boundary of a storage area of the management log in the memory area indicating a portion of the memory area to which the storage area of the management log extends in the memory area, that is, the range of a valid information storage area.

Further, recently, a configuration is proposed in which a nonvolatile RAM (for example, FeRAM, MRAM or the like) for data cache and management information storage and a NAND flash memory are combined based on the large capacity of the nonvolatile RAM and the various restriction conditions of the NAND flash memory. With this configuration, a problem relating to the management log as described before can be avoided by arranging management information that is frequently rewritten on the nonvolatile RAM. However, it is necessary to grasp data that has been written, that is, one of the pages that has been programmed in the block when the memory system is instantaneously turned off while data is being written into the NAND flash memory.

In "Semiconductor Device containing Flash Memory, Control Method of Flash Memory and Programming thereof", Jpn. Pat. Appln. KOKAI Publication No. 2004-310268, it is disclosed that storage of newest data having a given data length is additionally provided in a block of the flash memory erase unit. As a concrete example, storage data is searched for while addresses are changed in units of words from the start address of the block to the end address when data rewriting is performed in each erase block unit, and if the searched data items are all set at the logical level "1", which indicates the erase state, newest data items are sequentially written from the start address. On the other hand, when the searched data is set in the non-erase state, newest data is written from an address value if a derived address value derived by adding a preset numerical value to the address value is smaller than the end address value. On the other hand, if the derived address value derived by addition is larger than the end address value, data of the block is erased and newest data is written from the start address.

Further, in "Semiconductor Memory Device and Blank Page Searching Method thereof", Publication No. 2005-353171, a method for detecting a blank page in which the entire page is set in a data initial state (erased state) at high speed without reading data in the page in units of bytes is disclosed. As a concrete example, the potential of a bit line is sensed at the time of reading data from the memory cell, data of a selected memory cell is determined and the determined data is held in a data buffer. Then, whether or not all of the data buffers hold "0" data and whether or not all of the data buffers hold "1" data are both detected.

Jpn. Pat. Appln. KOKAI Publication No. 2004-310268 and Jpn. Pat. Appln. KOKAI Publication No. 2005-353171 propose a method for solving the problem by performing a process in the NAND flash memory.

DISCLOSURE OF INVENTION

This invention has been made to solve the conventional problems described above and an object of this invention is to provide a memory system capable of detecting the boundary between a data storage area (valid area of write data) and a data non-storage area (invalid area of write data) by detecting an erased page when data is stored in a flash-EEPROM nonvolatile memory.

According to one aspect of this invention, there is provided a memory system comprising a flash-EEPROM nonvolatile memory having a plurality of memory cells that have floating gates and in which data items are electrically erasable and writable, a cache memory that temporarily stores data of the flash-EEPROM nonvolatile memory, a control circuit that controls the flash-EEPROM nonvolatile memory and the cache memory, and an interface circuit that communicates with a host, in which the control circuit functions to read data from a desired target area to-be-determined of the flash-EEPROM nonvolatile memory and detect an erased area to determine a written area/unwritten area by using as a determination condition whether or not a count number of data "0" of the read data has reached a preset criterion count number.

BRIEF DESCRIPTION OF DRAWINGS

FIG. 4 is a diagram showing one example of a flowchart of processing steps in a memory system of a second embodiment of the present invention.

FIG. 5 is a diagram showing one example of a flowchart of processing steps in a memory system of a third embodiment of the present invention.

FIG. 6 is a diagram showing part of the configuration of the memory system of the third embodiment and one example of a data processing operation.

FIG. 8 shows part of the configuration of the memory system of the fourth embodiment and one example of a data processing operation.

FIG. 11 shows an example of the flash-EEPROM nonvolatile memory of the memory system.

BEST MODE FOR CARRYING OUT THE INVENTION

There will now be described embodiments of the present invention with reference to the drawings. In the description, common reference symbols are attached to common portions throughout the drawings.

First Embodiment

Figure 1:
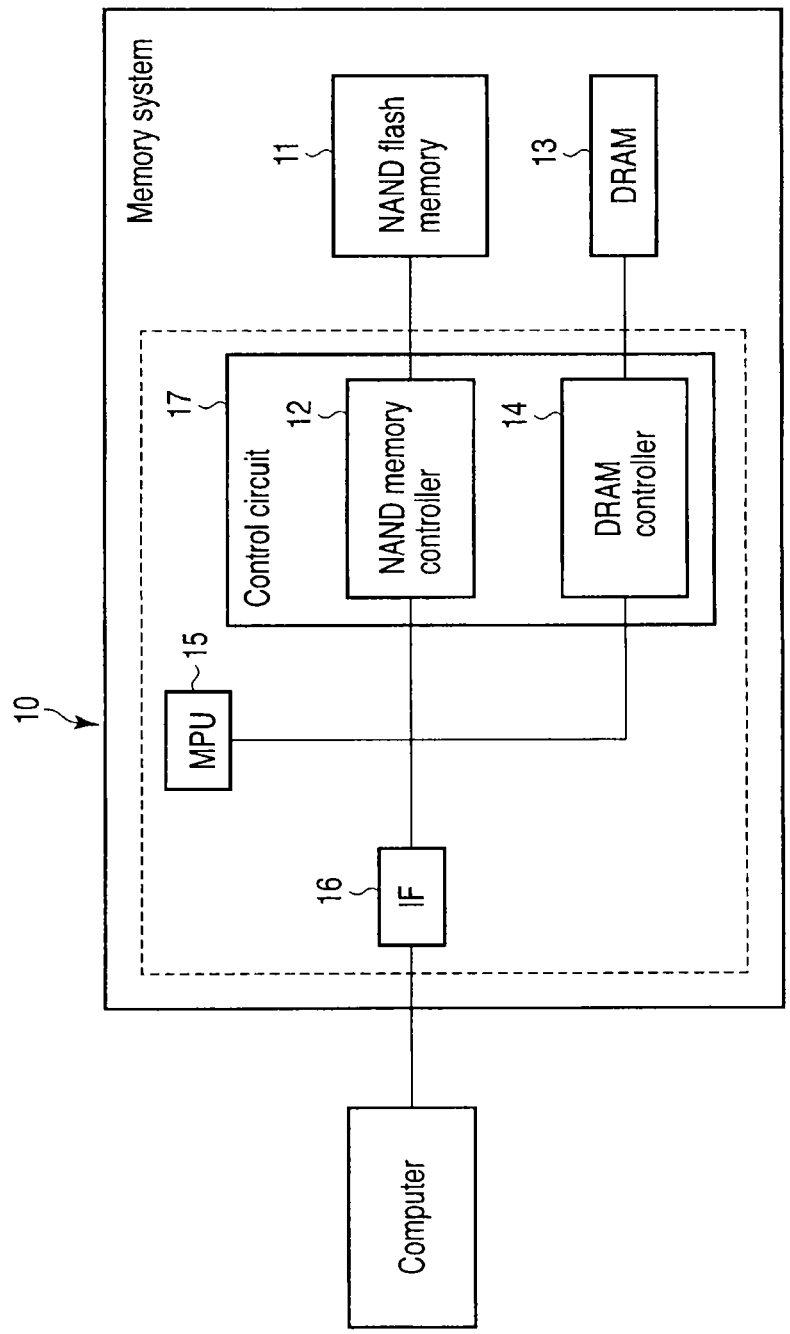
FIG. 1 is a block diagram of a memory system according to a first embodiment of the present invention.
Figure 2:
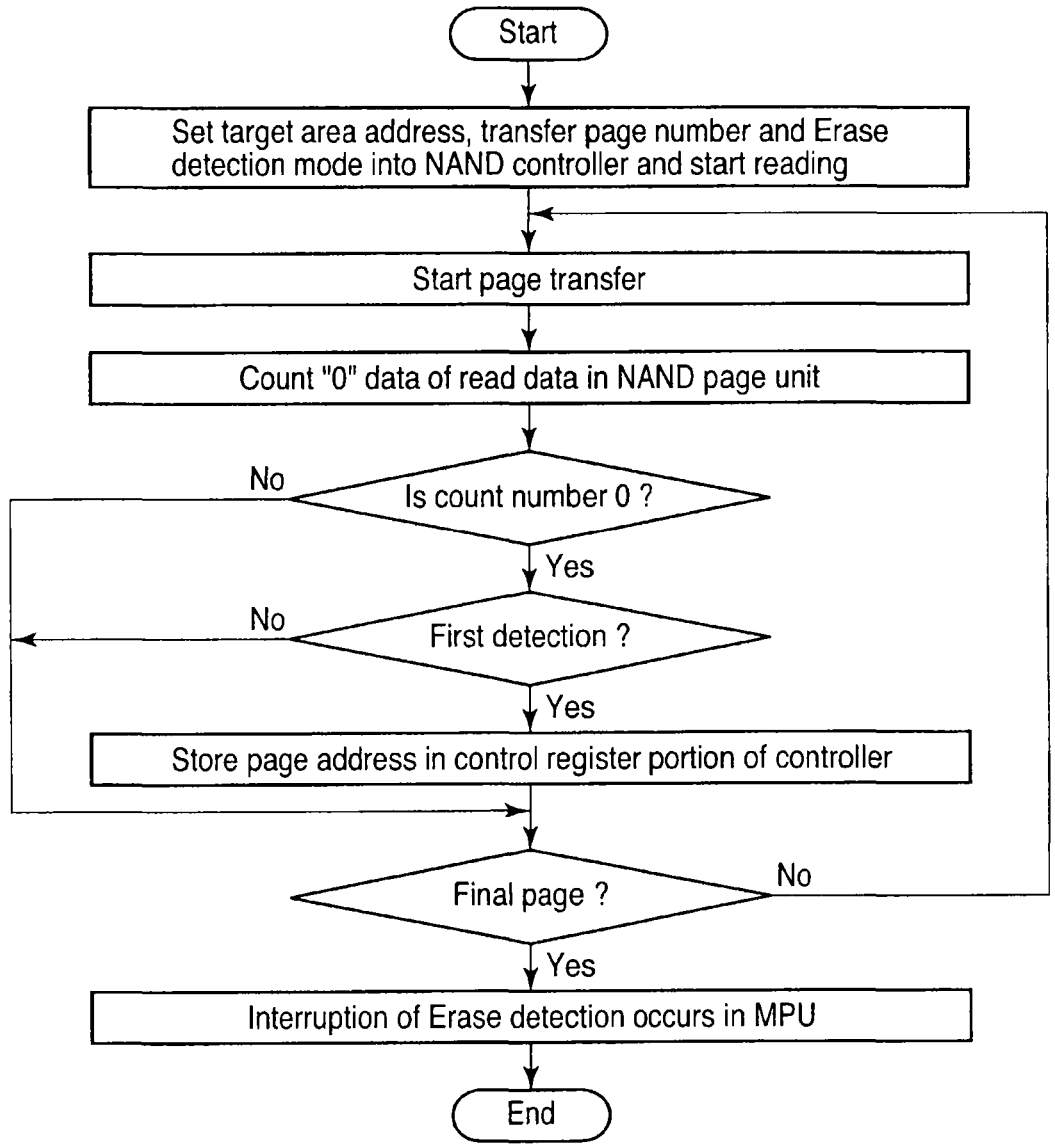
FIG. 2 is a diagram showing one example of a flowchart of processing steps in the memory system of FIG. 1.
Figure 3:
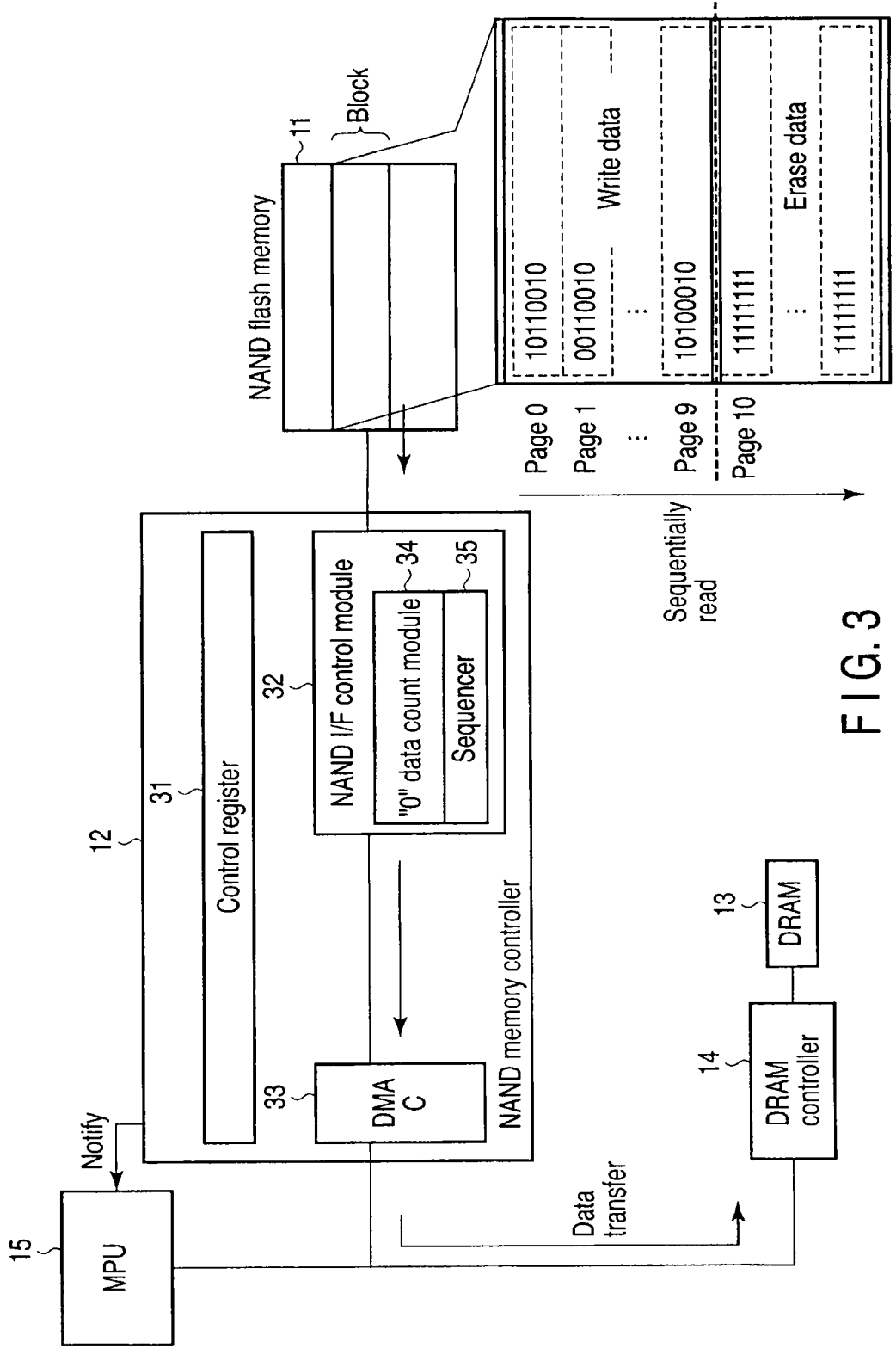
FIG. 3 is a diagram showing part of the configuration of the memory system of FIG. 1 and one example of a data processing operation.

FIG. 1 is a block diagram showing a memory system according to a first embodiment of the present invention. FIG. 2 shows one example of a flowchart of processing steps in the memory system of FIG. 1. FIG. 3 shows part of the configuration of the memory system of FIG. 1 and one example of a data processing operation.

As shown in FIG. 1, a memory system 10 includes a flash-EEPROM (electrically erasable and programmable read only memory) nonvolatile memory (in this example, NAND flash memory) 11 having a plurality of memory cells each of which has a floating gate and in which data can be electrically erased and written, a cache memory (in this example, DRAM (dynamic random access memory)) 13 that temporarily stores data of the NAND flash memory 11, a control circuit 17

(NAND memory controller 12, DRAM controller 14) that controls the above two types of memories, an MPU (micro processor unit) 15, and an interface circuit IF 16 that communicates with a host computer. The NAND flash memory is integrated with high density and has a large capacity and the DRAM has a higher read/write speed in comparison with a flash memory and has a medium capacity.

The MPU 15 has a function of setting information (start address, the number of transfer pages) of a target area of the NAND flash memory 11 in which an erased page is to be detected and an erased page detection mode into the NAND memory controller 12.

As shown in FIG. 3, the NAND memory controller 12 includes a control register 31, NAND-IF control module 32 and direct memory access controller (DMAC) 33. The NAND-IF control module 32 includes a "0" data count module ("0" data counter) 34, a sequence control circuit (sequencer) 35 that controls the procedure of processing operations, and the like.

The NAND memory controller 12 has a function of determining a written/unwritten area of the NAND flash memory 11 by determining an erased area of the NAND flash memory 11. In this example, the NAND memory controller 12 has a function of counting the number of data items "0" for each page in the NAND memory controller 12 while sequentially reading data items from the start address of the target area of the NAND flash memory 11 to the DRAM 13.

As the cache memory 13, either a volatile memory (such as a DRAM or SRAM) or nonvolatile memory (such as an FeRAM, MRAM, PRAM or RRAM) can be used.

In the process of the memory system of FIG. 1, first, the MPU 15 sets information (start address, the number of transfer pages) of a target area of the NAND flash memory 11 in which an erased page is to be detected and an erased page detection mode (Erase detection mode) into the NAND memory controller 12. Thus, the NAND memory controller 12 sequentially reads data items from the NAND flash memory 11 starting from the start position of the target area (in an ascending order from the page address "0") and starts page transfer. Since a page reverse-order programming inhibition restriction is set in the NAND flash memory 11, the NAND memory controller 12 reads data items starting from the page address "0" in an ascending order in the same block, that is, sequentially reads data items from the respective addresses in an address order in which data is first read from the page address "0", then data is read from the page address "1", data is read from the page address "2" and the like. In this example, the NAND memory controller 12 controls so that data is transferred from the NAND flash memory 11 to the DRAM 13 and the number of data items "0" for each page is counted in the NAND memory controller 12. At this time, if the target area is a written page, "0" data is generally mixed in with data itself read from the page. Therefore, when the number of data items "0" at the time of page transfer of data read from the NAND flash memory 11 is 0, it is regarded that the erased page is detected and the address thereof is stored in the control register 31 of the NAND memory controller 12. In this case, if it is detected that a page of a certain address is an erased page, it can be determined that pages of the addresses after the above address are erased pages based on the page reverse-order programming inhibition restriction. That is, the boundary between validity and invalidity of write data can be determined. In other words, since the data items stored in each page in the erased state are all "1" data items, data is read from an area in which the validity/invalidity of data is to be determined by the NAND memory controller 12, data "0" is counted for each unit area (one page) in the NAND memory controller 12, and it is determined that the unit area is an erased page if the count number is 0. At this time, since the page reverse-order programming inhibition restriction is set in the NAND flash memory 11, an address at which an erased page is first detected is held, and even if a new erased page is detected in the following data transfer, the page address at which the new erased page is detected is prevented from being written over the page address at which the erased page is first detected. The above detecting operation is continuously performed up to the final page. Then, the erased page detection result is notified to the MPU 15 by interruption or the like. As a result, the MPU 15 acquires a page address of erased page detection from the control register 31, grasps the boundary of valid data and configures management information.

In this embodiment, when in the erased page detection mode, it is assumed that data read from the NAND flash memory 11 is transferred to the DRAM 13. However, since there are some cases in which it is desired to detect only an erased page address without requiring data transfer, it is desirable to additionally provide a mode option indicating whether read data is transferred to the DRAM 13 or not.

The above process can also be performed by the MPU 15 connected to the NAND flash memory 11. In this case, however, since the time required for comparison of data items becomes long and becomes an overhead for other processes, the function of the process is provided on the NAND memory controller 12 in this embodiment.

Second Embodiment

FIG. 4 shows one example of a flowchart of processing steps in a memory system of a second embodiment of the present invention. In comparison with the memory system of the first embodiment described before, the memory system adds a function of immediately interrupting transfer of erased page detection to the DRAM 13 and reading from the NAND flash memory 11 in a case where an erased page is detected in the same block when the number of data items "0" is counted while transferring data of a target area in which an erased page is to be detected to the DRAM 13 to a sequencer 35 (FIG. 3).

Determination of validity/invalidity of write data can be made when an erased page is detected and since data after detection of the erased page is invalid data (erased data), it is not necessary to transfer the data to the DRAM 13. With this function, the extra data transfer time can be omitted and a processing time required in the system can be shortened.

Third Embodiment

FIG. 5 shows one example of a flowchart of processing steps in a memory system of a third embodiment of the present invention. FIG. 6 shows part of the configuration of the memory system of the third embodiment and one example of a data processing operation.

In the memory system of the first or second embodiment, the count number of data "0" is set to a value not smaller than one as a determination condition when the number of data "0" is counted while transferring data of an area in which an erased page is to be detected to the DRAM 13. In a NAND flash memory, it is common practice to use an error correction (ECC: error check and correction) circuit to take a countermeasure against aging deterioration of data and deterioration of cells accompanied by an increase in the number of writings during the operation. In this case, the data of a portion of each erased page may be set to "0" data even if the erase process is performed.

Therefore, in the memory system of the third embodiment, a function of making a determination threshold value of the count number of data "0" variable is provided. As one example of means for realizing the above function, as shown in FIG. 6, a setting register 62 that sets the count number of data "0" is provided in a control register 61 of the NAND memory controller 12 and determination is made by comparing the set value of the setting register 62 with the count value of the "0" data count module 34 that counts data "0".

Thus, if the number of defective bits is previously known, an erased page can be detected for a memory containing a defective bit by setting the "0" count number set value in the setting register 62 by the MPU 15.

Fourth Embodiment

Figure 7:
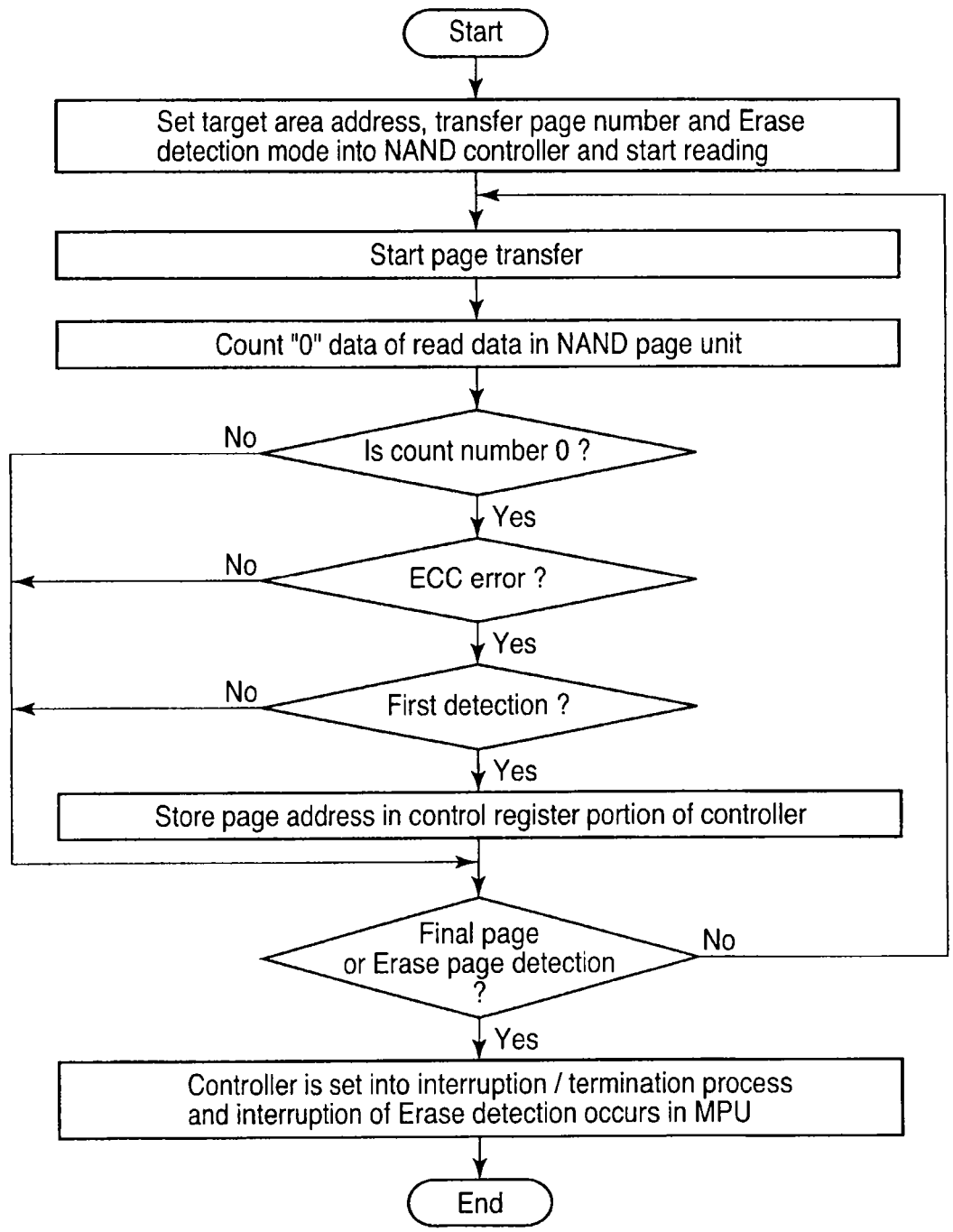
FIG. 7 shows one example of a flowchart of processing steps in a memory system of a fourth embodiment of the present invention.

FIG. 7 shows one example of a flowchart of processing steps in a memory system of a fourth embodiment of the present invention. FIG. 8 shows part of the configuration of the memory system of the fourth embodiment and one example of a data processing operation.

In the memory system the first to third embodiments, only the count number of data "0" is used as the erased page detection condition. On the other hand, recently, it is absolutely required to add an ECC code to data at the time of usage of a NAND flash memory. Further, in the NAND flash memory, a redundancy area used to store ECC codes is provided in one page. Since an ECC code is added to data written in the NAND flash memory and no ECC code is added in an erased page, an ECC error naturally occurs.

Therefore, as shown in FIG. 8, in the memory system of the fourth embodiment, an ECC module 81 is provided in a NAND memory controller 12. Then, a function for selecting a creation polynomial containing data "0" as an ECC code to be added to data even if data items written in the NAND memory controller 12 are all "1" data and determining the page being erased by using an ECC correction result in addition to the count number of data "0" as an erased page detection condition (determination condition) is provided in a sequencer 35.

Then, even in a structure in which an ECC code is added to data in view of the use of the NAND flash memory, the erased page can be precisely detected by performing an erased page detection process in two stages of determination based on the count number obtained by counting the number of data "0" by using a "0" data count module 34 and determination of presence or not of an ECC error while transferring data read from a target area of the NAND flash memory 11 in which an erased page is to be detected to the DRAM 13.

Fifth Embodiment

Figure 9:
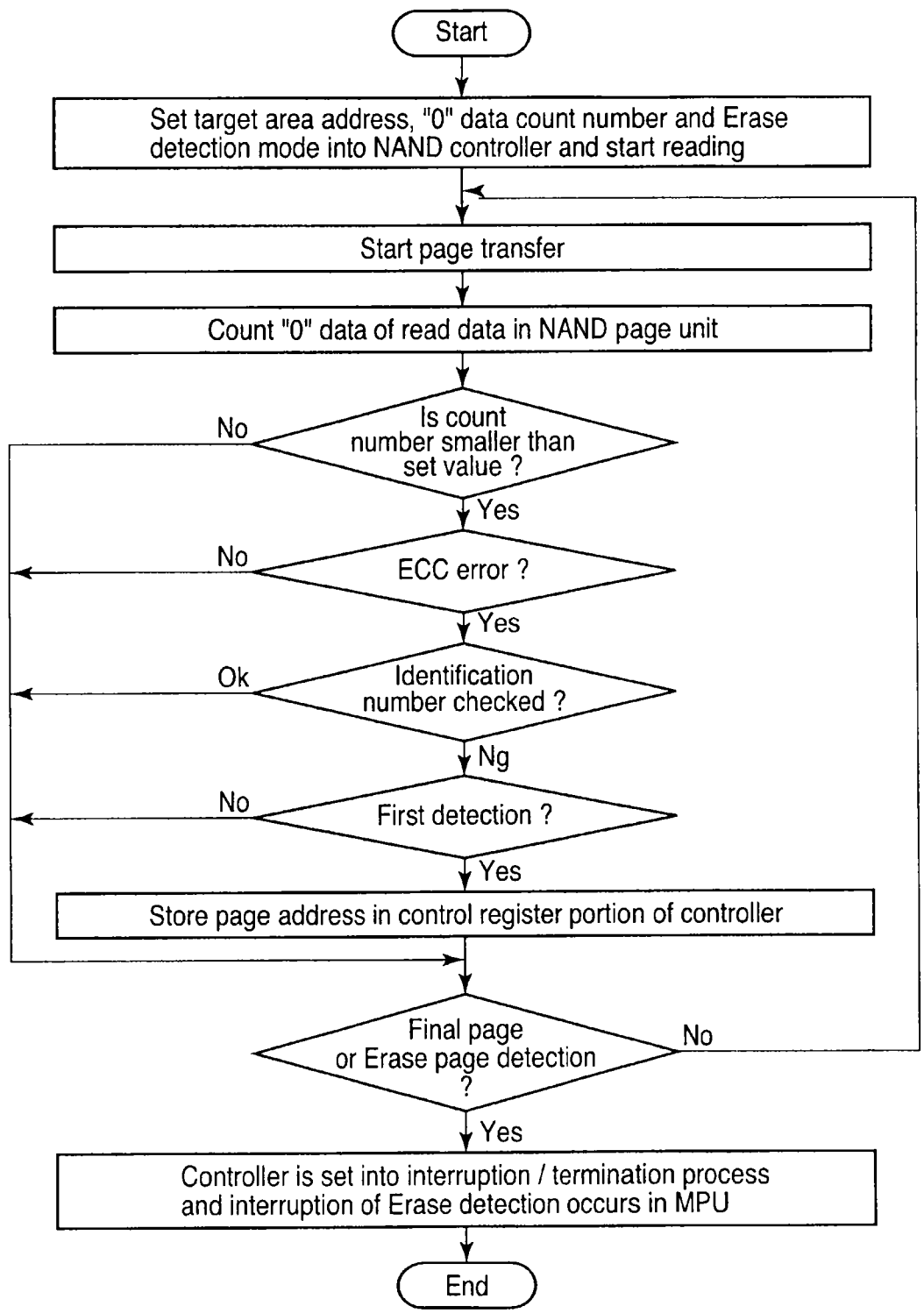
FIG. 9 shows one example of a flowchart of processing steps in a memory system of a fifth embodiment of the present invention.
Figure 10:
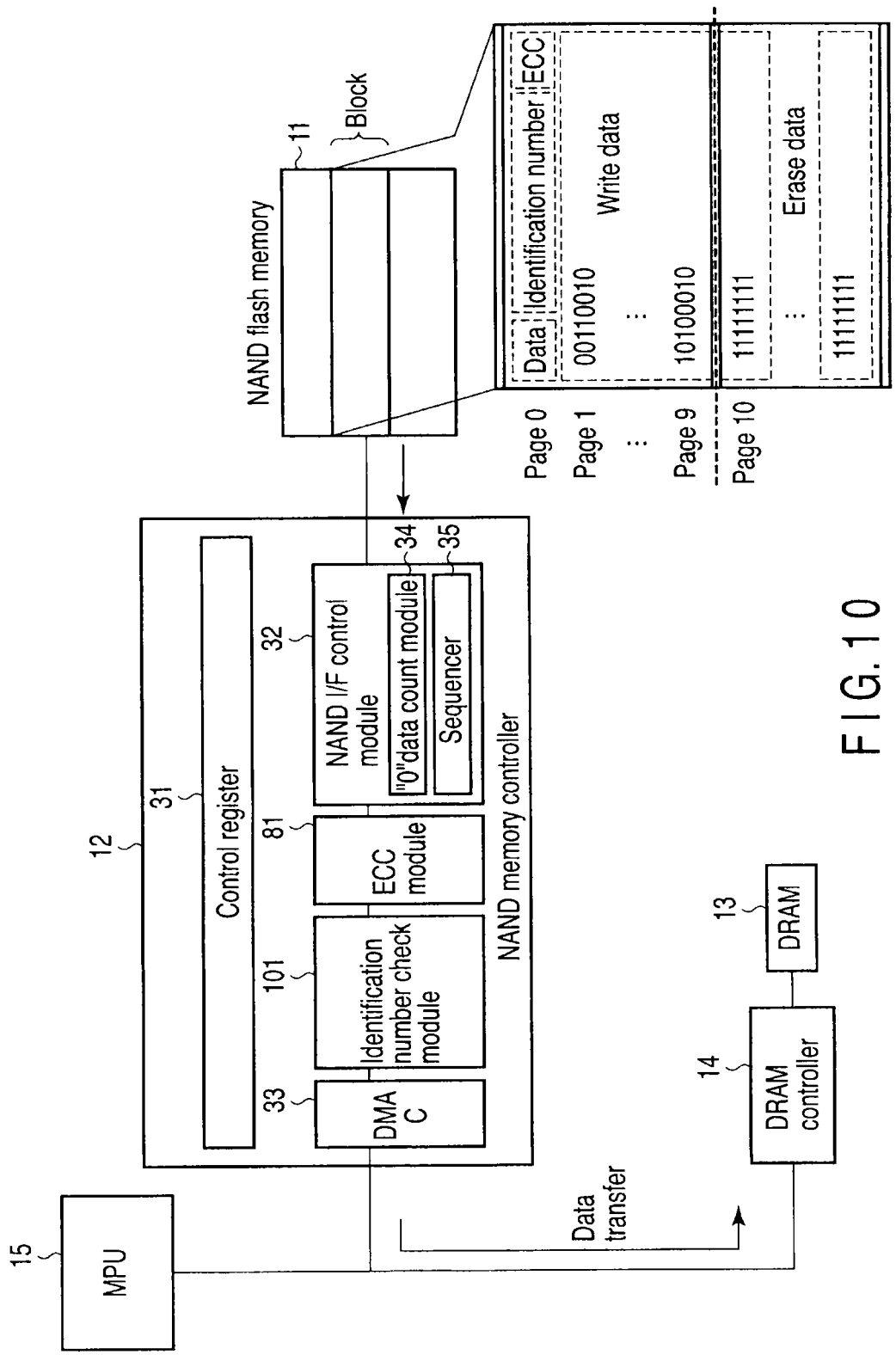
FIG. 10 shows part of the configuration of the memory system of the fifth embodiment and one example of a data processing operation.

FIG. 9 shows one example of a flowchart of processing steps in a memory system of a fifth embodiment of the present invention and FIG. 10 shows part of the configuration of the memory system of the fifth embodiment and one example of a data processing operation.

In comparison with the memory system of the fourth embodiment, in the memory system of the fifth embodiment, a function of adding an identification number to write data itself is provided. As one example of a means for realizing the function, as shown in FIG. 10, a module (identification number checking module) 101 that checks an identification number is provided in a NAND memory controller 12 and an identification number containing a plurality of data items "0" is provided when data is written into a NAND flash memory 11. Since the data size of a log of management information is not limited, it is easy to add the identification number. On the other hand, if the data size of data from the host side is determined (for example, the minimum unit of ATA that is HDD IF is 512 B), it is previously determined so as to write an identification number in the redundancy area of the NAND flash memory 11.

Thus, the erased page can be more precisely detected by adding a process of checking an identification number added to data at the write time and an identification number added to data at the read time when the read operation is performed for erase detection and determining the data as valid (written) data at the time of coincidence and as invalid (erased page) data at the time of non-coincidence to the detection condition of the fourth embodiment described before.

The method of writing the identification number in the write data itself as described above can be applied to not only the fourth embodiment but also the first to third embodiments.

Sixth Embodiment

Since a page reverse-order programming inhibition restriction is set in a NAND flash memory, it is considered that a page following after a page which is detected as an erased page is an erased page in the same block. In the memory system of each of the above embodiments described before, whether a page is an erased page or not is independently determined in the page unit, but in the sixth embodiment, a function of determining an erased page based on the relation between plural pages is provided in a sequencer 35.

For example, after an erased page is detected in the detection condition of the first to fifth embodiments, and if the next two pages are successively detected as erased pages (that is, three successive pages are erased pages), it is determined that the detected page is an erased page. In this case, a design is made to set the number of successive pages ("3" in the above example) used as a detection reference by use of a controller. However, even when successive pages are set to plural pages and if an erased page is detected in the remaining one page in the block, a process of ignoring the number of successive pages as the detection condition is performed.

FIG. 11 shows an example of the flash-EEPROM nonvolatile memory 11 of the memory system described in each of the embodiments, which is formed of a NAND flash memory. The flash-EEPROM nonvolatile memory 11 comprises a plurality of NAND cell units NU arranged in a matrix. Each of the NAND cell units comprises a plurality of series-connected memory cell transistors MC (in this example, MC0 to MC31). The NAND cell units NU arranged in the row direction constitute a memory block BLK as a minimum unit of data erase. In this example, memory blocks BLK0 to BLKn are arranged in the row direction. Each of the memory cell transistors MC has a floating gate electrode formed on a semiconductor substrate via a tunnel insulating film, and a control gate electrode laminated on the floating gate electrode via an inter-gate insulating film.

One end of each NAND cell unit NU is connected to a corresponding bit line BL via a selection gate transistor ST1, and the other end thereof is connected to a common source line CELSRC via a selection gate transistor ST2. The control gate electrodes of the memory cell transistors MC of the same row extend in the memory cell row direction and are connected in common to constitute a word line WL (in this example, WL0 to WL31). The control gate electrodes of the selection gate transistors ST1 of the NAND cell units NU in the same block BLK extend in the memory cell row direction and are connected in common to constitute a selection gate line SGD. Similarly, the control gate electrodes of the selection gate transistors ST2 of the NAND cell units NU in the same block BLK extend in the memory cell row direction and are connected in common to constitute a selection gate line SGS. The word lines WL, the selection gate lines SGD and the selection gate lines SGS are driven in accordance with address inputs supplied from the NAND memory controller 12.

INDUSTRIAL APPLICABILITY

It is effective to apply the disclosed memory system to a NAND flash memory that is restricted by various restriction conditions since it is possible to detect the boundary between the data storage area and the data non-storage area (the boundary between the valid area and invalid area of write data) by detecting an erased page when data is stored in the flash-EEPROM nonvolatile memory that can be formed with a large capacity.

The invention claimed is:

1. A memory system comprising:
   a nonvolatile memory comprising a plurality of storage areas each including memory portions that each store one of a first data item and a second data item;
   a cache memory that temporarily stores data read from the nonvolatile memory;
   a control circuit that controls the nonvolatile memory and the cache memory, the control circuit comprising a counter that is configured to count the number of the first data items; and
   an interface circuit that communicates with a host,
   wherein the control circuit is configured to execute:
   a first determination in which it is determined whether data is written in each of the storage areas, counting a number of first data items stored in the memory portions in each of the storage areas; and
   a second determination in which the storage areas are sequentially read to determine a boundary between a first storage area in which data is written and a second storage area in which data is not written.

2. The memory system according to claim 1, wherein when the second data is stored in all of the memory portions in one of the storage areas, the control circuit is configured to determine that the one of the storage areas is the second storage area with no data.

3. The memory system according to claim 1, wherein when the first data item is stored in at least one of the memory portions in one of the storage areas, the control circuit is configured to determine that the one of the storage areas is the first storage area in which data is written.

4. The memory system according to claim 1, wherein addresses are assigned to the respective storage areas, and the control circuit is configured to read the storage areas in an order of address.

5. The memory system according to claim 1, wherein when executing the first determination, the control circuit is configured to acquire an address assigned to the second storage area without transferring, to the cache memory, the data read from the nonvolatile memory.

6. The memory system according to claim 1, wherein the control circuit is configured to set a variable determination criterion in association with the first determination.

7. The memory system according to claim 1, wherein
   the control circuit comprises an ECC module, the ECC module being configured to generate an ECC code including the first data item, and to add, when the second data item is stored in all of the memory portions of one of the storage areas, the ECC code to the one of the storage areas; and
   when executing the first determination, the control circuit is configured to use, as a determination condition for the first determination, whether data read from the nonvolatile memory contains an ECC error.

8. The memory system according to claim 1, wherein
   the control circuit has a function of adding an identification number including the first data item to each of the storage areas; and
   when executing the first determination, the control circuit is configured to use, as a determination condition for the first determination, whether the identification number is added to data read from the nonvolatile memory.

9. The memory system according to claim 1, wherein the control circuit is configured to use a number of times of sequential detection of the second storage area as a determination condition for the first determination.

10. The memory system according to claim 1, wherein each of the storage areas is a read unit.

* * * * *